(12) United States Patent
Schaffer et al.

(10) Patent No.: US 9,684,039 B2
(45) Date of Patent: Jun. 20, 2017

(54) FLUXGATE MAGNETIC SENSOR READOUT APPARATUS

(71) Applicant: TEXAS INSTRUMENTS DEUTSCHLAND GMBH, Freising (DE)

(72) Inventors: Viola Schaffer, Freising (DE); Mikhail Valeryevich Ivanov, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/043,924

(22) Filed: Feb. 15, 2016

(65) Prior Publication Data

US 2016/0161571 A1 Jun. 9, 2016

Related U.S. Application Data

(63) Continuation of application No. 14/177,323, filed on Feb. 11, 2014, now Pat. No. 9,261,571.

(60) Provisional application No. 61/866,446, filed on Aug. 15, 2013, provisional application No. 61/867,478, filed on Aug. 19, 2013.

(51) Int. Cl.
*G01R 33/04* (2006.01)
*G01R 33/00* (2006.01)

(52) U.S. Cl.
CPC ..... *G01R 33/0041* (2013.01); *G01R 33/0023* (2013.01); *G01R 33/04* (2013.01)

(58) Field of Classification Search
CPC ... G01R 33/04; G01R 33/0041; G01R 33/023
USPC .......................................................... 324/253
See application file for complete search history.

(56) References Cited

U.S. PATENT DOCUMENTS

| | | | |
|---|---|---|---|
| 2,711,512 A * | 6/1955 | Rockwell | H03C 1/16 330/115 |
| 3,571,700 A | 3/1971 | Paine et al. | |
| 6,278,272 B1 | 8/2001 | Scarzello et al. | |
| 7,298,141 B2 | 11/2007 | Bartington | |
| 7,391,210 B2 | 6/2008 | Zhang et al. | |
| 7,391,211 B2 | 6/2008 | Cripe | |
| 8,339,133 B2 | 12/2012 | Teppan | |
| 9,261,571 B2 * | 2/2016 | Schaffer | G01R 33/04 |

OTHER PUBLICATIONS

Bazzocchi, et al. "Interference rejection algorithm for current measurement using magnetic sensor arrays", Sensors and Actuators 85 (2000), pp. 38-41.
Dezuari, et al. "Printed circuit board integrated fluxgate sensor", Sensors and Actuators 81 (2000), pp. 200-203.

(Continued)

*Primary Examiner* — Reena Aurora
(74) *Attorney, Agent, or Firm* — Gregory J. Albin; Charles A. Brill; Frank D. Cimino

(57) ABSTRACT

Compact, low power fluxgate magnetic sensor readout circuits and apparatus are presented in which demodulator or rectifier circuit to modulates a sense signal from the fluxgate sense coil, and the demodulated signal is provided to an amplifier circuit with a transconductance or other amplifier and one or more feedback capacitors connected between the amplifier input and amplifier output to integrate the amplifier output current and provide a voltage output signal indicating the magnetic field sensed by the fluxgate sensor.

19 Claims, 6 Drawing Sheets

(56) References Cited

OTHER PUBLICATIONS

Tang, et al. "Excitation circuit for fluxgate sensor using saturable inductor", Sensors and Actuators A 113 (2004), pp. 156-165.
Drljaca, et al., "Low-Power 2D Fully Integrated CMOS Fluxgate Magnetometer", IEEE Sensors Journal, vol. 5, No. 5, Oct. 2005, pp. 909-915.
Drljaca et al., "Single Core Fully Integrated CMOS Micro-Fluxgate Magnetometer", Elsevier B.V., Science Direct, Sensors and Actuators A 110 (2004) (Accepted Sep. 15, 2003) pp. 236-241.
Chiesi, et al., "CMOS Planar 2D Micro-Fluxgate Sensor", 2000 Elsevier Science S.A., Sensors and Actuators 82 (2000) (Accepted Nov. 10, 1999), pp. 174-180.
Kawahito, et al., "A 2-D CMOS Microfluxgate Sensor System for Digital Detection of Weak Magnetic Fields", IEEE Journal of Solid-State Circuits, vol. 34, No. 12, Dec. 1999, pp. 1843-1851.
Prosecution history for U.S. Appl. No. 14/177,323, filed Feb. 11, 2014, 194 pages.

\* cited by examiner

FLUXGATE MAGNETIC SENSOR READOUT APPARATUS

This application is a continuation of U.S. patent application Ser. No. 14/177,323, filed Feb. 11, 2014, which claims priority to and the benefit of U.S. Provisional Patent Application Ser. Nos. 61/866,446, filed on Aug. 15, 2013, and 61/867,478, filed on Aug. 19, 2013, the entirety of each of which is incorporated by reference herein.

FIELD OF THE INVENTION

The present disclosure relates to magnetic sensors and more particularly to improved sensor readout circuitry for fluxgate magnetic sensors.

BACKGROUND

Fluxgate magnetic sensors are used in a variety of applications to produce a corresponding output signal representing a detected magnetic field, for example, for current sensors, electronic compass or digital magnetometer devices, and position sensing applications. Fluxgate devices are constructed using a magnetic core with excitation and sense windings or coils, with the excitation coil being driven with a bidirectional signal and the sense coil providing an output signal which can be integrated to determine the external magnetic field strength. Several different approaches have been commonly used for interfacing fluxgate sense coils with external circuitry in order to provide an output voltage signal or digital value representing the detected external magnetic field. Many conventional sensor readout circuits amplify the output voltage and obtain an average value through filtering, and certain approaches employ a delta-sigma modulator and integrator for producing a sensor output. Certain proposed designs use sample and hold circuits or nonlinear averaging circuitry known as box-car circuits requiring precise timing control to store the voltages on capacitors of the individual boxcar circuits, with an adder to measure the voltage equivalent representing the maximum of the induced signal in the sense coil over a series of steps. Other fluxgate sensor readout circuits use rectifiers with low pass filters in which the signal is filtered and thus averaged through a full excitation cycle or period in order to produce a rectified voltage signal proportional to the measured magnetic field. However, these conventional approaches require significant amounts of circuitry and therefore occupy valuable space on an integrated circuit, and averaging through a full excitation cycle lowers the effective gain. Accordingly there is a continuing need for improved sensor readout apparatus for fluxgate magnetic sensors to provide output signals indicating a detected magnetic field while occupying minimal integrated circuit area without consuming excessive power.

SUMMARY

The present disclosure provides magnetic sensors and readout circuitry in which the signal from a fluxgate sensor coil is demodulated and provided to a transconductance or other amplifier with one or more feedback capacitors to integrate the amplifier output current and provide a voltage signal representing the detected magnetic field. By this construction, a simple, compact and low-power sensor readout apparatus is provided without requiring complicated timing and control circuitry and filtering found in conventional sensor readout circuits.

In accordance with one or more aspects of the present disclosure, a fluxgate magnetic sensor readout apparatus is provided, including a demodulator circuit with switches operated according to one or more switching control signals, and an amplifier circuit comprised of an amplifier and at least one feedback capacitance connected between the amplifier output and the amplifier input to provide a voltage output signal indicating a magnetic field sensed by a fluxgate magnetic sensor. In certain embodiments, a single ended transconductance amplifier can be used, or the amplifier may be a differential output transconductance amplifier with feedback capacitors individually connected between a corresponding amplifier output and amplifier input to integrate the differential output current provided by the transconductance amplifier. In certain embodiments, moreover, a reset circuit is provided to selectively discharge the feedback capacitance, and control circuitry may selectively provide a reset control signal for discharging the feedback capacitance every integer number N sensing cycles, where N is greater than or equal to one. The integer number N, moreover, may be configurable according to a signal provided to the control circuit, for example, to provide an adjustable gain by which the amplifier output current from multiple excitation cycles may be integrated by the feedback capacitance to facilitate sensing low-level magnetic fields. In certain embodiments, a disable circuit is provided to selectively connect the demodulator inputs together to disable the sensor readout apparatus, thereby mitigating integration of noise by the amplifier circuit when the sensor is not being used.

Magnetic sensing apparatus is provided in accordance with further aspects of the present disclosure, including a fluxgate sensor, an excitation circuit, and a sensor circuit providing an amplifier with integrating feedback capacitance for generating an output signal representing a sensed magnetic field, together with a control circuit controlling the timing of a periodic bidirectional excitation waveform provided from the excitation circuit to the fluxgate sensor excitation coil. Further aspects of the disclosure provide a sensor interface circuit for interfacing a fluxgate magnetic sensor, including an excitation circuit for providing a periodic bidirectional waveform to an excitation coil, as well as a sensor readout circuit with a demodulator and an amplifier circuit including an amplifier and one or more integrating feedback capacitances.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
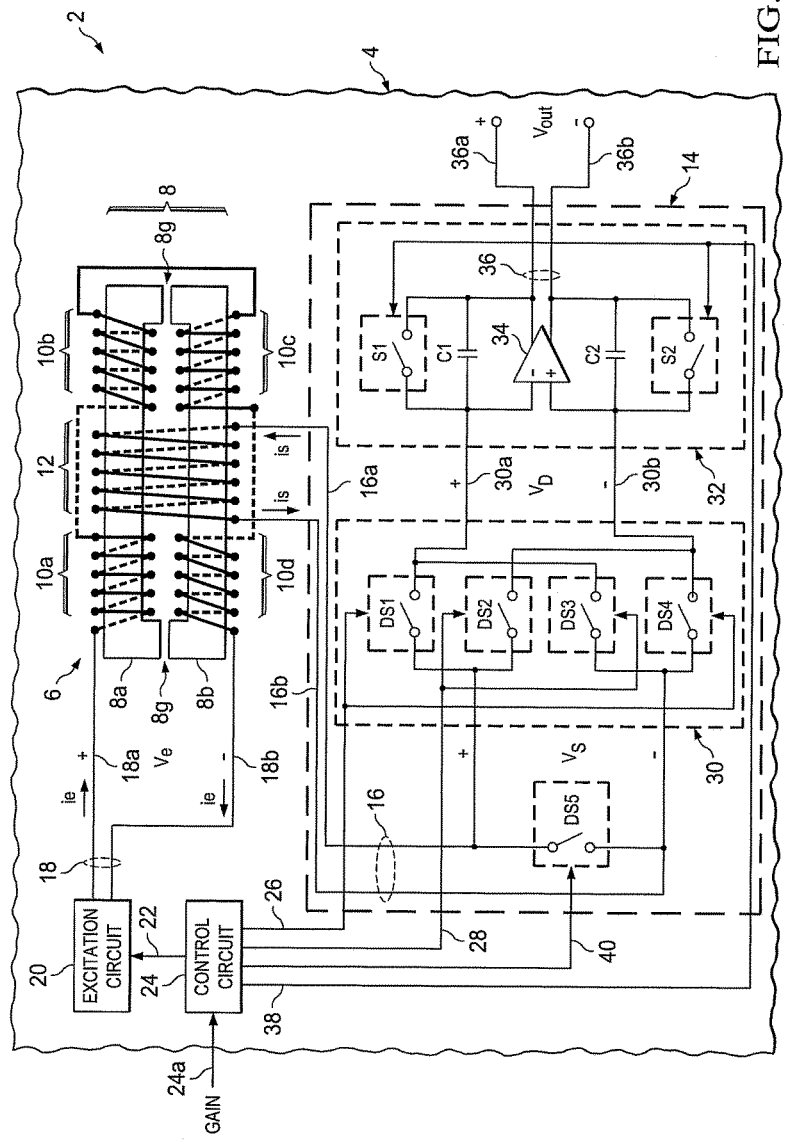
FIG. 1 is a partial schematic top plan view illustrating an exemplary fluxgate magnetic sensor apparatus formed on or in a substrate of an integrated circuit including an associated excitation circuit and a sensor readout circuit with a switching rectifier or demodulator and a differential output amplifier with integrating feedback capacitors in accordance with one or more aspects of the present disclosure.

One or more embodiments or implementations are hereinafter described in conjunction with the drawings, wherein like reference numerals are used to refer to like elements throughout, and wherein the various features are not necessarily drawn to scale. The present disclosure provides interface circuitry and sensor readout apparatus, as well as integrated fluxgate magnetic sensors, illustrated and described hereinafter in the context of a fluxgate magnetometer integrated circuit with on-board fluxgate sensor structure. The various aspects of the present disclosure can be employed in connection with external fluxgate sensor structures, or with fluxgate sensors having different numbers and configurations of excitation and/or sensor coils, and it will be appreciated that the sensor readout concepts of the present disclosure are not limited to the illustrated examples.

Referring initially to FIG. 1, an exemplary fluxgate sensor apparatus 2 is illustrated, providing a single integrated circuit solution in certain embodiments formed on and/or in a semiconductor substrate 4 and includes a fluxgate magnetic sensor 6, an integrating sensor readout circuit 14, an excitation circuit 20 and a control circuit 24. The exemplary fluxgate sensor 6 includes a magnetically susceptible core 8, such as a high magnetic permeability core structure 8 which may be formed on and/or in the substrate 4, with an excitation winding or coil 10 including excitation coil sections 10a, 10b, 10c and 10d wound around portions of the core 8, and a centrally located sense winding 12. In the illustrated example, the windings 10 and 12 are formed around corresponding portions of the core structure 8 using conductive portions on different layers of the substrate assembly 4, with solid lines showing winding portions above the corresponding core structure 8 and dashed-lines showing winding portions below the corresponding core structure 8 in the illustrated view. Any number of excitation and sense windings 10, 12 may be used in different embodiments. In this example, moreover, the magnetically susceptible core structure 8 includes two longitudinally opposite gaps 8g separating bilaterally symmetrical core portions 8a and 8b. Other designs are possible in which no gap 8g is used, or a single gap may be provided, or more than two such gaps 8g may be included in the core structure 8. Furthermore, the core portions 8a and 8b may, but need not be symmetrical in all embodiments. In addition, the coil windings in different embodiments can take on many different variations, which in general should not impact the sensor readout aspects of the present disclosure, and additional coils can be included on the fluxgate sensor 6 without impact on the sensor readout circuitry 14.

The excitation circuit 20 can be any suitable circuit which provides an AC excitation signal 18, such as a periodic bidirectional pulse waveform, to the excitation windings 10 via connections 18a and 18b to the respective first and second ends of the excitation coil 10. In one non-limiting embodiment, the excitation circuit 14 is an H-bridge switching circuit operative according to one or more timing control signals 22 from the control circuit 24 to selectively provide a positive pulse at a positive supply voltage, and then a negative pulse at a negative supply voltage to the excitation coil 10 in each of a series of excitation cycles, preferably with periods of no applied voltage between successive alternating pulses. In one non-limiting example, the excitation circuit 20 provides alternating excitation current waveforms "ie" to the excitation windings 10 to alternately drive the core structure 8 through magnetic saturation and demagnetization in opposite polarities or directions, thereby inducing an electrical sense current flow "is" in the sensing coil 12. When the core structure 8 is exposed to an external magnetic field (e.g., to the left in the orientation shown in FIG. 1), the core structure 8 is more easily saturated in alignment with that field, and less easily saturated in opposition to the external field. Consequently, the induced sense coil current "is" will be out of phase with the excitation current, and the difference will be related to the strength of the external magnetic field. The excitation pulse durations and frequency can be any suitable values, preferably alternately driving the core 8 into and out of saturations of opposite polarity or direction to generate a signal on the sense coil 12 that is detected by the sensor readout apparatus 14, with the control circuitry 24 providing the timing control signal(s) 22 accordingly. In addition, the control circuit 24 synchronizes operation of the sensor readout circuitry 14 with that of the excitation circuit 20 for suitable demodulation of the sense coil signal to provide an output voltage signal $V_{OUT}$ 36 at output terminals 36a and 36b representing the magnetic field proximate the fluxgate sensor 6.

Figure 3:
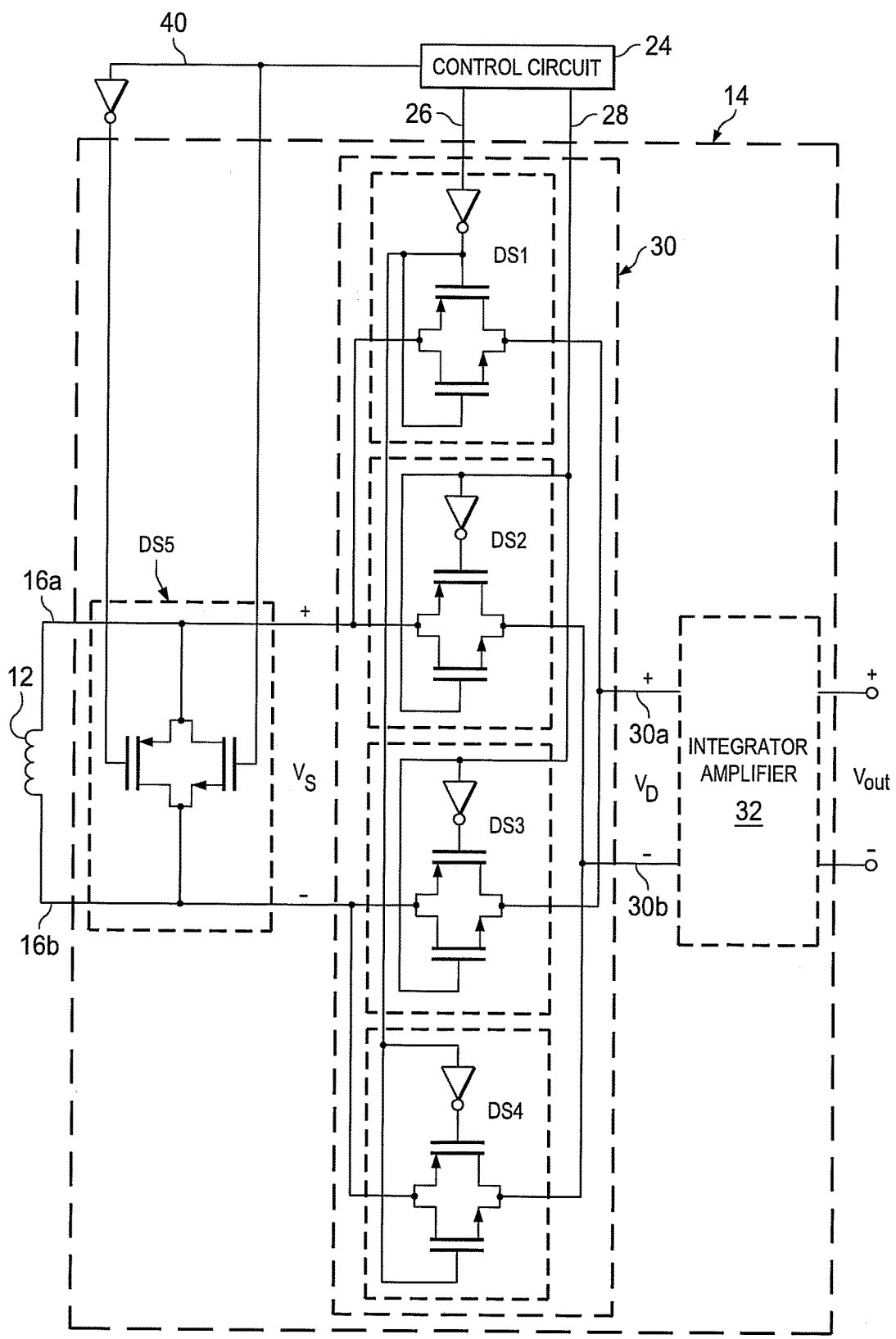
FIG. 3 is a partial schematic diagram illustrating an exemplary switching demodulator circuit in the sensor readout circuit of FIG. 1.

Referring also to FIG. 3, the sensor readout circuitry 14 receives a sensor coil signal 16 via connections 16a and 16b to ends of the sense coil 12, and provides one or more output signals or values 36, such as a differential or singled-ended voltage signal $V_{OUT}$ based at least partially on the sensor signals 16 received from the sense winding 12. The sensor readout circuit 14 includes a demodulator circuit 30 which is synchronized with the excitation circuit 20 via control signals 26 and 28 from the control circuit 24 to demodulate the sense signal "is" and the corresponding sense coil voltage signal $V_S$ received from the sense coil 12. The demodulator circuit 30 provides an output, in this case a demodulated differential voltage $V_D$ at first and second demodulator output terminals 30a and 30b to corresponding input terminals of an amplifier circuit 32. In the non-limiting example of FIG. 1, the demodulator 30 has a first input 16a connected to one end of the sense coil 12, and a second demodulator input 16b connected to the second end of the sense coil 12, along with a demodulator switching circuit, in this example formed by demodulator switches DS1-DS4 connected as shown.

Figure 2:
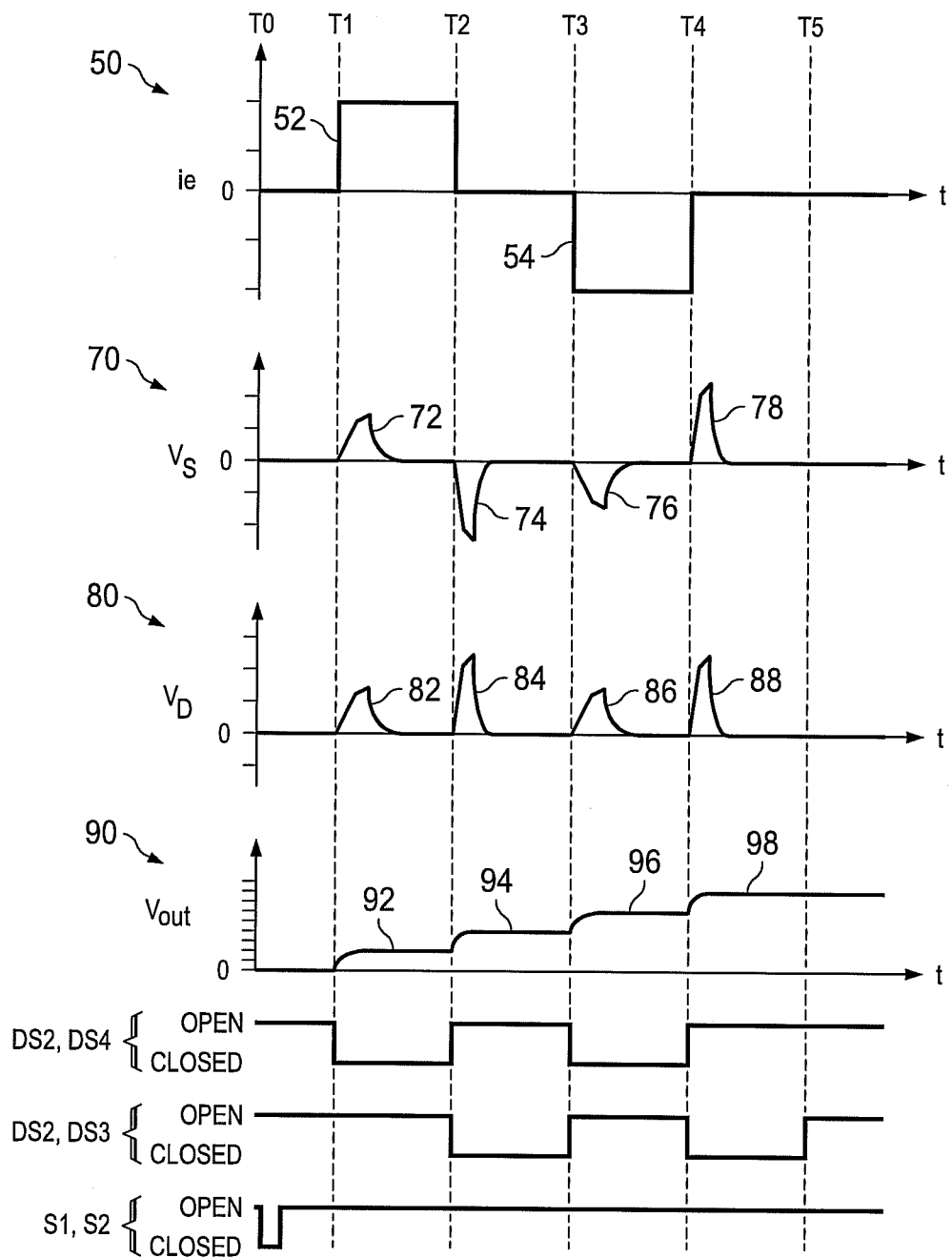
FIG. 2 is a waveform diagram illustrating excitation, sensing, and control signaling in the magnetic sensor apparatus of FIG. 1.

FIG. 3 illustrates one non-limiting example of a switched demodulator or rectifier circuit 30, including a pair of source/drain coupled PMOS and NMOS transistor assemblies forming each of the switching transistors DS1-DS4. In this case, the control circuit 24 provides the switching control signals 26 and 28 to operate the NMOS transistors of assemblies DS1-DS4, and control signal inverters are provided to activate the corresponding PMOS devices of DS1-DS4. The gate control terminals of DS1-DS4 are controlled by the control circuit 24, with DS1 operating according to a switching control signal 26 in a first state to connect the first demodulator input 16a to the first demodulator output 30a, and with DS4 also operating according to the signal 26 in a first state to connect the second demodulator input 16b to the second demodulator output 30b. In the first state, therefore, the demodulator circuit 30 transfers a positive sense coil voltage $V_S$ unaltered to the output terminals 30a and 30b. DS2 and DS3 operate according to another switching control signal 28 from the control circuit 24 in a second state of the demodulator switching circuit to connect the first demodulator input 16a to the second demodulator output 30b (DS2) as well as to connect the second modulator input 16b to the first demodulator output 30a (DS3), thereby inverting the demodulated voltage $V_D$ in the second demodulator state. The control circuit 24 alternately asserts the signals 26 and 28 in order to alternate operation of the demodulator switching circuit DS1-DS4 between the first and second states, for example, as shown in FIG. 2 below, with the control circuit 24 effectively switching the demodulator states at a frequency twice that of the excitation circuit 20. In addition, certain embodiments provide for controlling the durations of the actuation of the sensor readout circuit switching signals 26 and 28, for example, such that an intervening space or period of time is provided between connections of the input terminals 16a, 16b with the output terminals 30a, 30b, although not a strict requirement of all possible embodiments. Moreover, the electrical coupling of the selected one of the input terminals 16a, 16b with the demodulator outputs 30a, 30b may be direct electrical connection across the source/drain of the corresponding transistor DS1-DS4 as shown or other intervening circuit components (not shown) may be included in the electrical coupling in various embodiments. Moreover, although illustrated as using field effect transistors for field effect transistor assemblies DS1-DS4, other forms of electronic switches may be used, e.g., bipolar transistors, etc.

In accordance with various aspects of the present disclosure, moreover, the amplifier circuit 32 is comprised of an integrating amplifier 34 with inputs connected to the demodulator output terminals 30a and 30b, with one or more feedback capacitances C1, C2 connected between the amplifier output 36 and a corresponding amplifier input to integrate output current from the amplifier output 36 and provide the voltage output signal $V_{OUT}$ indicating the magnetic field sensed by the fluxgate sensor 6. The amplifier circuit 32 of FIG. 1 is a transconductance amplifier, although op amps or other amplifier circuitry can be used in various embodiments. The amplifier 34 provides a differential voltage output 36 $V_{OUT}$ at the amplifier output terminals 36a and 36b via differential output terminals of the transconductance amplifier 34. Another non-limiting example is illustrated below in FIG. 6, in which the amplifier 34 provides a single ended voltage output via terminals 36a (connected to the transconductance amplifier output terminal) and 36b (connected to a circuit ground GND). In the differential amplifier output example of FIG. 1, a first feedback capacitor C1 is connected between the first amplifier output 36a and the first amplifier input (30a), and a second feedback capacitor C2 is connected between the second amplifier output 36b and the second amplifier input (30b). In various implementations, an offset cancellation circuit (not shown) can be included within the amplifier 34 or can be provided at the amplifier inputs between the demodulator outputs 30a and 30b and the inputs to the amplifier 34 for full or partial cancellation of amplifier offsets, for example, using correlated double-sampling, auto-zeroing, etc. In one non-limiting embodiment, a switched capacitor circuit (not shown) is coupled between the amplifier inputs and the demodulator outputs 30a and 30b, and operates to store capacitor voltages measured while the switches S1, S2 and DS5 are closed in FIG. 1, thereby storing voltage representing any amplifier offsets. In normal operation, the offset cancellation circuitry then connects the individual switched capacitors in series with the integrating capacitors C1 and C2 thereby cancelling, at least partially any amplifier offset effects on the final output voltage $V_{OUT}$ provided at the output terminals 36a and 36b of the amplifier circuit 32. In addition, the illustrated embodiment includes a reset circuit with a first switch S1 connected in parallel with C1 and a second switch S2 connected in parallel with C2, where the switches S1 and S2 are controlled via a control signal 38 from the control circuit 24 for selective resetting of the transconductance amplifier output voltage $V_{OUT}$ to zero by discharging the capacitors C1 and C2 when the switches S1 and S2 are closed or conductive.

FIG. 2 illustrates waveform graphs showing various exemplary signals during operation of the magnetic sensing apparatus 2. The graph 50 in FIG. 2 illustrates one cycle of an exemplary excitation current waveform "ie" provided by the excitation circuit 20 to the excitation coil 10, including an initial positive pulse 52 beginning at T1 and ending at T2, followed by a time interval T2-T3 in which no excitation current is applied to the coil 10, and a subsequent negative pulse 54 applied from T3 through T4. As seen in the graph 70 of FIG. 2, moreover, the provision of the excitation pulses from the excitation circuit 20 causes sense coil voltage pulses 72, 74, 76 and 78, with an initial positive sense coil pulse 72 resulting from the initiation of the first excitation pulse 52 at T1, and a subsequent negative voltage pulse 74 beginning at T2 upon discontinuance of the first excitation pulse 52. Thereafter, the sense coil voltage $V_S$ includes another negative voltage pulse 76 following initiation of the negative excitation pulse 54 beginning at T3, and a final positive sense coil voltage pulse 78 beginning at T4 following deactivation of the excitation pulse 54.

FIG. 2 further illustrates exemplary closed and open states of the demodulator transistors DS1-DS4 controlled via signals 26 and 28. In this example, DS1 and DS4 are closed in the first demodulator state from T1 through T2 and from T3 through T4, and DS2 and DS3 are closed in the second demodulator state for a given period of time starting at T2 and again at T4, where the transistors DS2 and DS3 may remain closed until T3 in certain embodiments, although not a strict requirement of all implementations. As a result of the operation of the demodulator circuit transistors DS1-DS4 via the control signals 26 and 28, graph 80 in FIG. 2 illustrates the resulting demodulated output voltage $V_D$ including positive pulses 82, 84, 86 and 88, with the selective switching operation of DS1-DS4 creating all the pulses 82-88 in the positive direction, whereby the demodulator 30 provide a switching rectification of the sense coil voltage pulses shown in graph 70, with the voltage pulses 82, 84, 86 and 88 being provided as an input voltage $V_D$ to the amplifier circuit 32, and thus as a differential voltage input to the transconductance amplifier 34.

In operation, output current provided by the first transconductance amplifier output 36a charges the feedback capacitor C1, and output current conducted by the second transconductance amplifier output 36b charges the capacitor C2. The transconductance amplifier 34 provides output currents to the terminals 36a and 36b corresponding to the received demodulator output voltage pulses 82, 84, 86 and 88. In this configuration, the rectified signal of the sense coil 12 is loaded with the low impedance of the transconductance amplifier 34, with the voltage signal $V_D$ from the demodulator circuit 30 being converted to a current output that is integrated onto the feedback capacitance C1, C2. Thus, no intermediate or additional circuitry is needed to do integration, and the voltage output provided at the amplifier output 36 indicates the area under the pulses 82-84 from the demodulator 30, and thus represents the sensed magnetic field proximate the sensor apparatus 2. In particular, the charging of the feedback capacitors C1 and C2 performs an integration of the transconductance amplifier output currents, with the resulting capacitor voltages across C1 and C2 being additive to present the differential output voltage signal $V_{OUT}$ across the terminals 36a and 36b. Operation of the integrating transconductance amplifier circuit 32 thus provides a compact solution with significantly lower complexity and power consumption than conventional sensor readout circuitry.

Graph 90 in FIG. 2 illustrates the output voltage $V_{OUT}$, including incremental increases or steps 92, 94, 96 and 98 corresponding to the integrated contributions associated with the demodulator output voltage pulses 82, 84, 86 and 88, respectively. As a result, the output voltage 36 from the transconductance amplifier 34 with the feedback capacitances C1 and C2 represents the total energy contribution of the positive and negative sense coil pulses 72, 74, 76 and 78 shown in the graph 70, and thus indicates the magnetization of the fluxgate sensor structure 6 corresponding to any external field proximate to the magnetic sensing apparatus 2.

As seen in FIG. 1, moreover, the reset circuit switches S1 and S2 are operated according to a reset signal 38 from the control circuitry 24. In certain embodiments, the control circuit 24 provides the demodulator switching control signals 26 and 28 to operate the switching circuit DS1-DS4 sequentially in the first and second states in each of a series of sensing cycles (one cycle is shown in FIG. 2), and the control circuit 24 also provides the reset signal 38 to selectively discharge the feedback capacitor C1 and C2 every integer number "N" sensing cycles, with N being greater than or equal to one in various embodiments. As shown in FIG. 2, moreover, the control circuit 24 in one implementation closes the switches S1 and S2 via the signal 38 to discharge the capacitors C1 and C2 prior to the beginning of the cycle, with FIG. 2 further illustrating a sensor output read time T5 at which a host system (not shown) is provided with the voltage output $V_{OUT}$ from the amplifier circuit 32. In one possible implementation, for example, a sample and hold circuit (not shown) may receive the voltage signal from the terminals 36a and 36b, and the sample and hold is triggered or clocked at time T5 shown in FIG. 2, whereby the sampled voltage is at the level corresponding to the voltage step 98 shown in graph 90.

In certain embodiments, moreover, the integer number N implemented by the control circuit 24 is configurable according to a gain input signal 24a provided to the control circuit 24 as shown in FIG. 1. In one possible non-limiting implementation, for instance, the gain signal 24a is provided by the host system. In other possible implementations, moreover, the control circuit 24 can be preprogrammed with the integer number N. The host system in this regard may selectively change the integer number N to be greater than 1, for example, to increase the gain of the sensing apparatus 2 for measuring low level magnetic fields, and may selectively reduce the integer number N for measurement of higher field strengths. For example, with N=2, the amplifier circuit output 36 represents the energy contributions of demodulated output voltage pulses 82-88 over two sensing cycles (eight pulses), and for N=3, represents the contributions of pulses over three cycles, etc. In this manner, increasing the value of N increases the gain of the sensing apparatus 2, and a host system may selectively adjust the value of N (in integer increments) in certain embodiments using the gain signal or value 24a, which can be a single signal, a digital value, or other signal or value by which an integer number N can be provided to the control circuit 24. In other possible implementations, the value of N can be configurable, for example, for use of a sensing apparatus integrated circuit product 2 in different environments having different external magnetic field sensing requirements (e.g., low gain products configured with a low value of N, higher gain products configured with a higher value of N, etc.).

As further shown in FIGS. 1 and 3, certain embodiments further provide a disable circuit, in this case a switch DS5 (FIG. 1) such as a PMOS/NMOS transistor pair (FIG. 3) operated via a disable signal 40 from the control circuit 24 to selectively connect the first and second demodulator inputs 16a and 16b together to disable the sensor readout apparatus 14. In certain implementations, the control circuitry 24 actuates the signal 42 close DS5 while opening the modulator switches DS1-DS4, and may also contemporaneously close the switches S1 and S2 to fully disable integration operation of the sensor readout apparatus 14. In this manner, actuation of DS5 (to render DS5 closed or conductive) prevents further integration by the amplifier 34, and thus mitigates integration of noise effects into the output 36, for example, when the sensor apparatus 2 is not in use. In certain embodiments, the control circuit 24 may receive an input signal from an external (e.g., host) system, to place the sensor readout apparatus 14 in a disabled or non-operating state, with the control circuit 24 accordingly providing the switching control signal 40 to disable operation of the apparatus 14.

Figure 4:
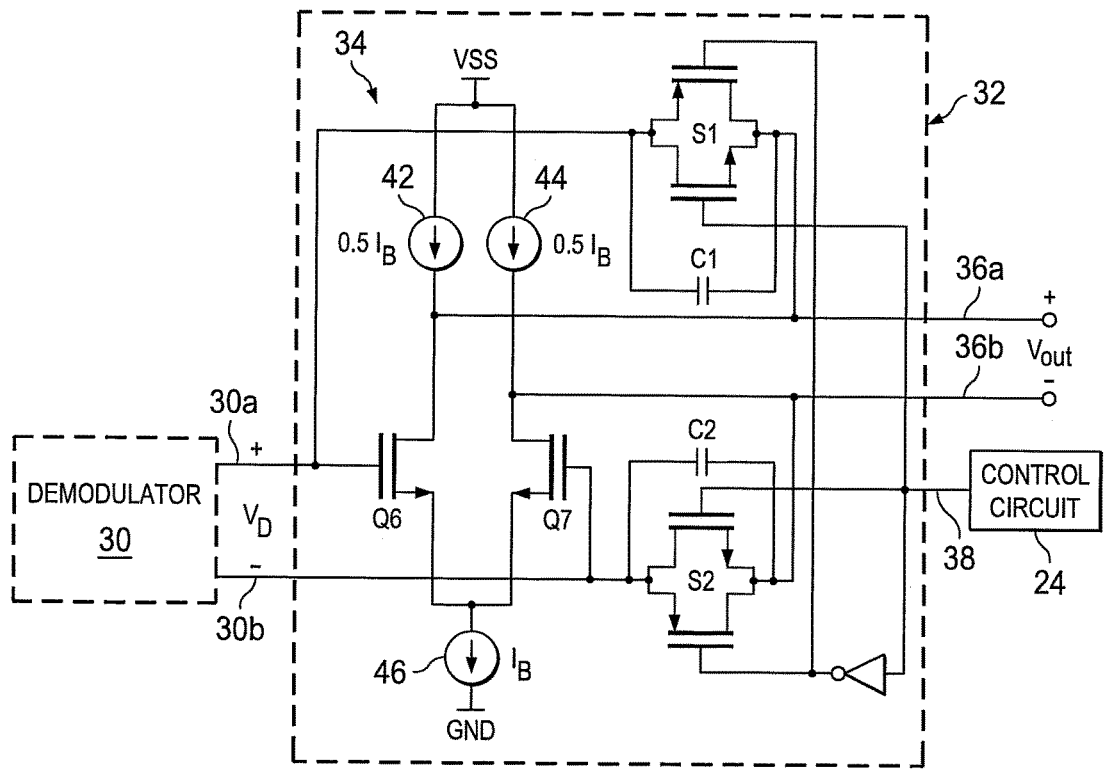
FIG. 4 is a partial schematic diagram illustrating an exemplary differential output transconductance amplifier circuit embodiment with an NMOS differential input stage.
Figure 5:
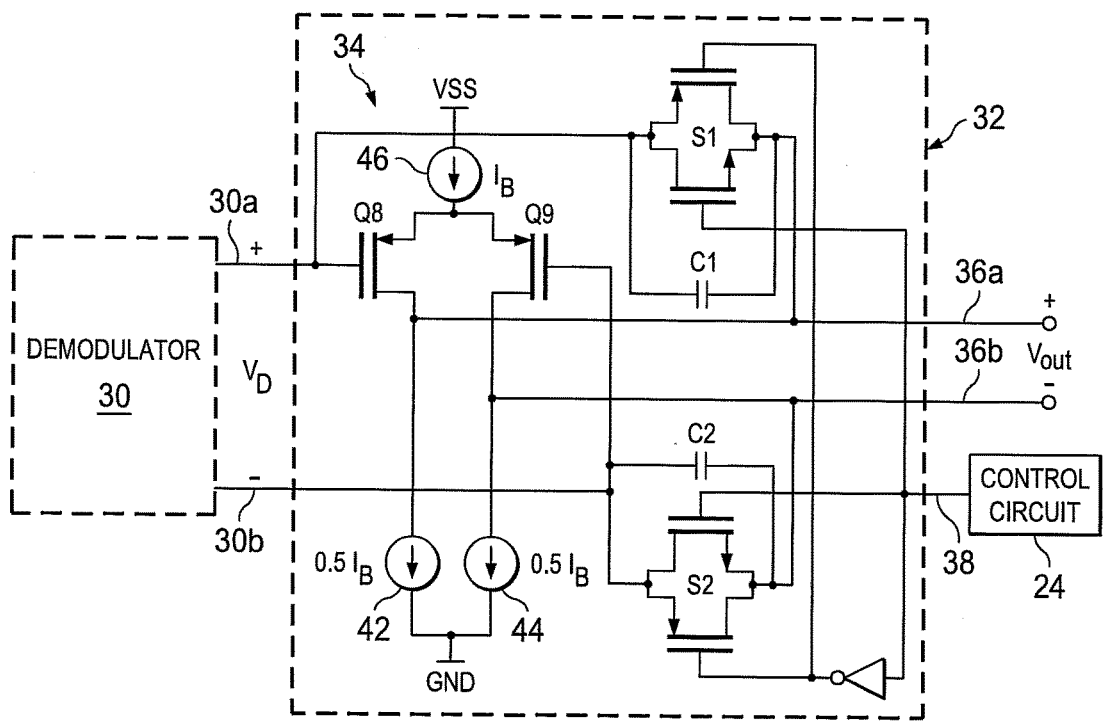
FIG. 5 is a partial schematic diagram illustrating another exemplary differential output transconductance amplifier embodiment with a PMOS differential input stage.

Referring now to FIGS. 1, 4 and 5, any suitable amplifier 34 can be used which receives a voltage input and provides an output, where FIGS. 4 and 5 illustrate field effect transistor differential output transconductance amplifier examples. In the example of FIG. 4, for instance, the transconductance amplifier 34 includes a first transistor Q6 (in this case an NMOS device) with a gate connected to the first demodulator output 30a and a drain connected to the first amplifier output 36a and to a first current source 42 conducting 50% of a bias current level $I_B$, with the upper terminal of the current source 42 connected to a positive supply voltage VSS. A second NMOS transistor Q7 forms a differential input stage with Q6 and has a gate connected to the second demodulator output 30b and a drain connected to the second amplifier output 36b, with a second current source 44 (also 0.5 $I_B$) connected between VSS in the drain of Q7 as shown. In addition, the transconductance amplifier 34 in this case includes a third current source 46 conducting a biased current level $I_B$ from the sources of Q6 and Q7 to the supply ground GND. As seen in FIG. 4, moreover, the individual reset circuit switches S1 and S2 may be implemented in one example using a PMOS transistor and an NMOS transistor connected as shown across the corresponding first and second feedback capacitors C1 and C2, with the control circuit 24 providing an active high control signal 38 directly to the NMOS devices of S1 and S2, and with an inverted control signal being provided to the PMOS devices.

FIG. 5 illustrates an alternate differential output embodiment of the transconductance amplifier 34, in which a first PMOS transistor Q8 has a gate connected to the demodulator output 30a, a drain connected to the first amplifier output 36a, and a source connected through a current source 46 ($I_B$) to VSS. In addition, the drain of Q8 is connected through current source 42 (0.5 $I_B$) to GND. A second PMOS transistor Q9 in this case has a gate connected to the second demodulator output 30b, a source connected to the lower terminal of the current source 46, and a drain connected to the second amplifier output 36b and to the other current source 44 (also 0.5 $I_B$) as shown. The current sources 42, 46 and 48 in the embodiments of FIGS. 4 and 5 can be constructed using any suitable circuit components, for example, MOS transistors forming current mirror circuits, etc.

Figure 6:
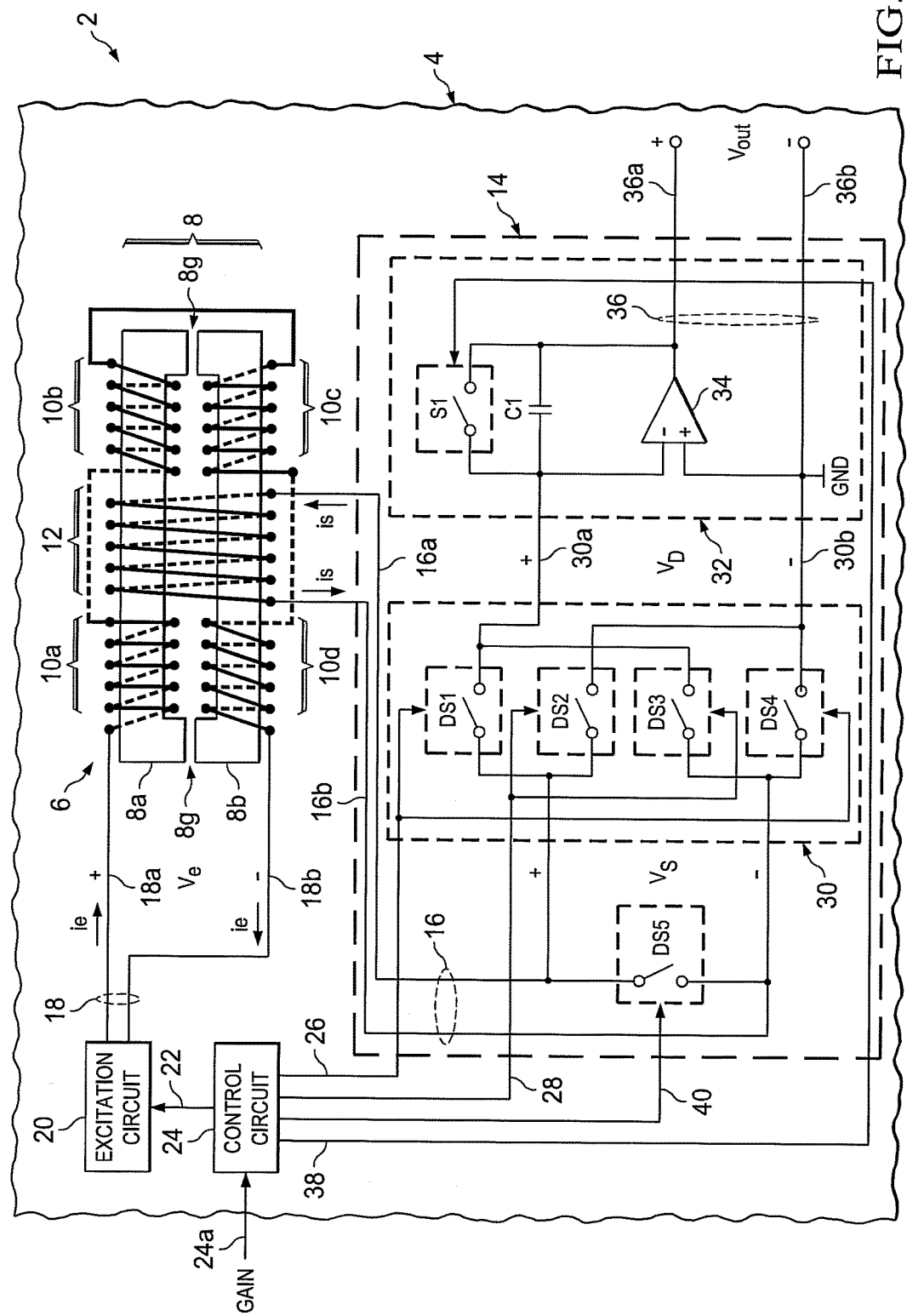
FIG. 6 is a partial schematic top plan view illustrating another exemplary fluxgate magnetic sensor apparatus including a sensor readout circuit with a demodulator and a single ended output amplifier with an integrating feedback capacitance according to the present disclosure.
Figure 7:
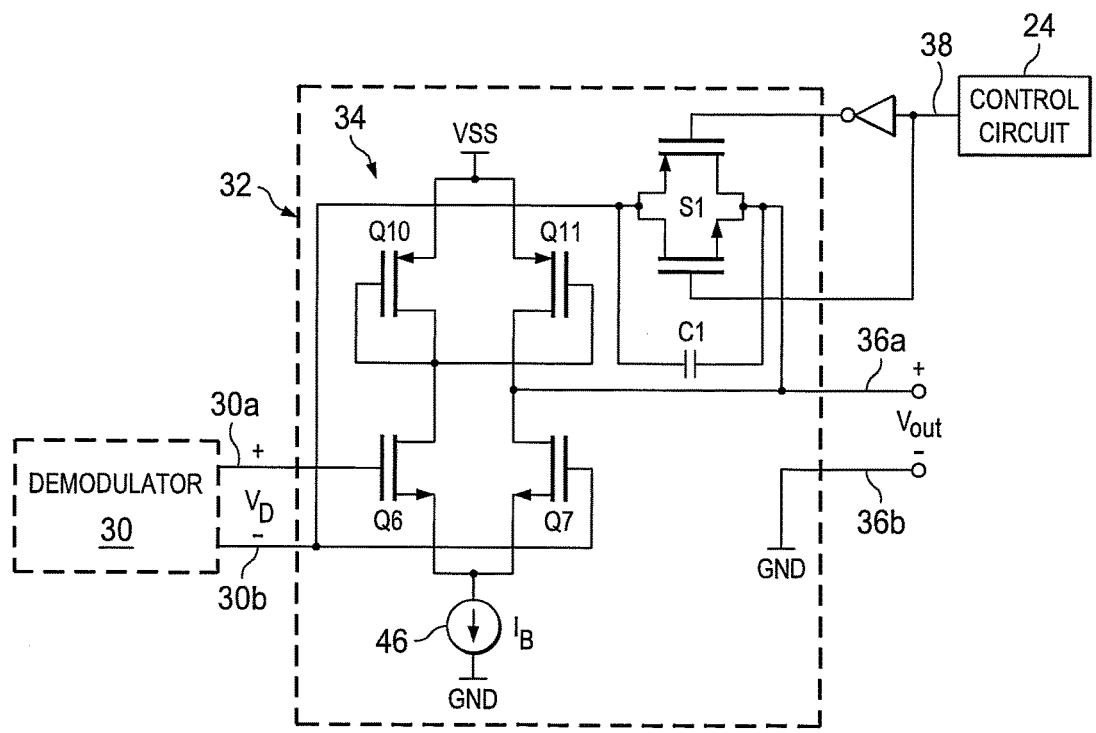
FIG. 7 is a partial schematic diagram illustrating an exemplary single ended output transconductance amplifier circuit embodiment with an NMOS differential input stage in the sensor apparatus of FIG. 6.
Figure 8:
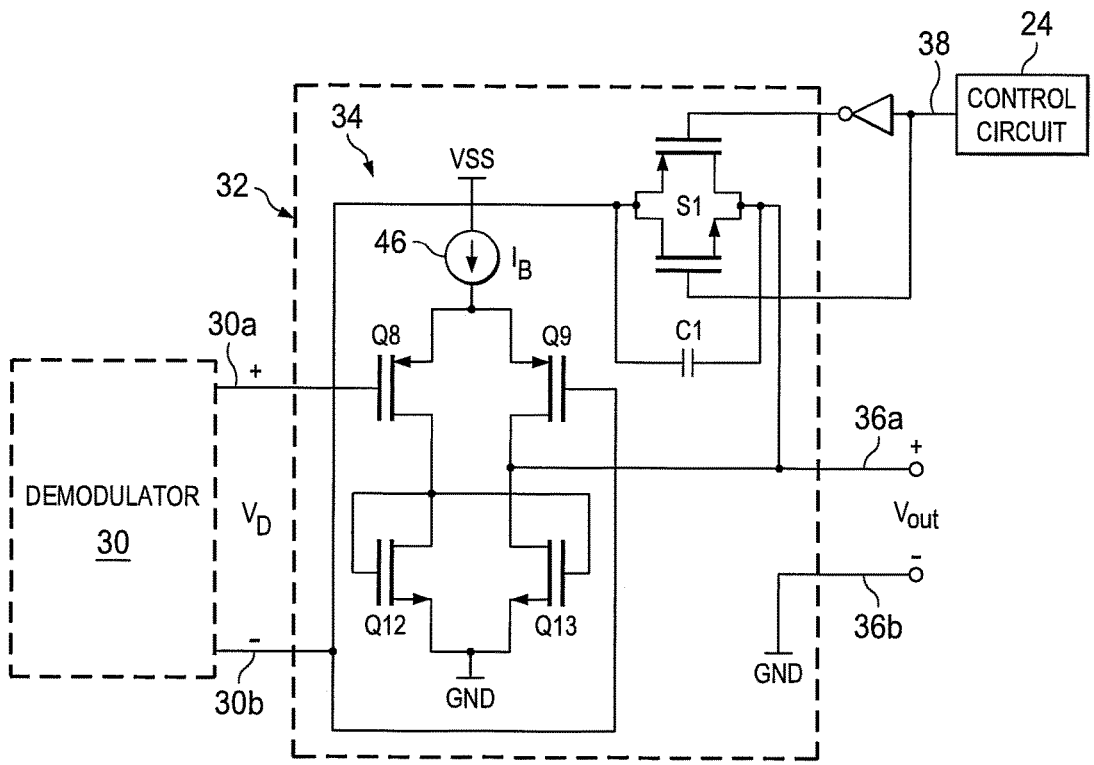
FIG. 8 is a partial schematic diagram illustrating another exemplary single ended output transconductance amplifier circuit embodiment with a PMOS differential input stage.

Referring now to FIGS. 6-8, FIG. 6 illustrates another fluxgate magnetic sensor apparatus 2 similar to that described above in connection with FIG. 1, with the amplifier circuit 32 including an amplifier 34 having a single ended output 36, with a second amplifier output 36b connected to a circuit ground GND, in which the second demodulator output terminal 30b is also connected to GND as shown. Any suitable single ended amplifier can be used, examples of which are illustrated in FIGS. 7 and 8. In FIG. 7, an exemplary single ended transconductance amplifier 34 includes a first NMOS transistor Q6 with a gate connected to the first demodulator output 30a and a first current source implemented using a PMOS transistor Q10 connected between a positive voltage supply node VSS and the drain of Q6, where the current source transistor Q10 has a gate and drain connected to one another and to the gate of another PMOS transistor Q11, with Q11 and Q10 forming a current mirror to individually conduct half of a bias current level $I_B$. The example of FIG. 7 further includes a second NMOS transistor Q7 with a gate connected to the second demodulator output 30b and a drain connected to the first amplifier output terminal 36a as shown, where the second current mirror PMOS transistor Q11 is connected between VSS and the drain of Q7. In addition, a third current source 46 ($I_B$) is connected between the sources of Q6 and Q7 and the circuit ground GND as shown.

FIG. 8 illustrates an alternate single ended output transconductance amplifier embodiment, including a first PMOS transistor Q8 with a gate connected to the first demodulator output 30a, and a drain connected to the drain and gate of a current source NMOS transistor Q12 (conducting 0.5 $I_B$), where Q12 and another NMOS current source transistor Q13 form a current mirror with sources connected to GND. A second PMOS transistor Q9 has a gate connected to the second demodulator output 30b and a drain connected to the drain of Q13 and to the first amplifier output terminal 36a as shown. In addition, a current source 46 conducting current $I_B$ is connected between the upper supply node VSS and the sources of Q8 and Q9.

As seen in the single ended output examples of FIGS. 7 and 8, moreover, a single feedback capacitor C1 can be used, which is connected between the first amplifier output 36a and the second transconductance amplifier input (e.g. the gate of Q7 in FIG. 7 or the gate of Q9 in FIG. 8), and thus operates to integrate the output current provided by the transconductance amplifier 34. Also, the reset circuit in this case includes a single switch S1 (implementing these examples using an NMOS transistor and a PMOS transistor operated according to the control signal 38 from the control circuit 24) connected across the feedback capacitance C1.

The integrating transconductance amplifier circuitry 32 thus advantageously provides a single compact circuit approach to perform integration of the amplifier output current without complicated switching or filtering circuitry, and provides an output voltage $V_{OUT}$, whether single ended or differential, which is proportional to the magnetic field that is being sensed by the sensor apparatus 2. In this regard, the illustrated embodiments advantageously integrate the signal from the demodulator directly as a current, and thus no additional current-to-voltage conversion circuitry is needed, whereby various implements of the concepts of the present disclosure present an advance over conventional techniques and facilitate compact, power efficient solutions. In addition, the operation of the reset circuitry S1 (and S2 for differential implementations) advantageously provides a gain control for the apparatus 2, thus facilitating operation for sensing a wide variety of external magnetic field magnitudes. Moreover, the embodiments employing the disable circuit DS5 advantageously facilitate low noise operation, with the control circuit 24 being configured to selectively disable operation of the amplifier integration by shorting the terminals of the sense coil 12 to prevent integration of circuit noise when the sensor is not in use. In addition, the disclosed integrating transconductance amplifier approaches disclosed herein advantageously provide a low power solution, with the high frequency input signal received from the sense coil 12 being integrated without requiring use of a high-speed amplifier in order to reconstruct and/or amplify the signal. Furthermore, the disclosed designs do not require precise timing, and provide a selectable adjustment to increase the apparatus gain, and thus facilitate lower sensitivity to circuit offset and noise issues without averaging over a time window. In addition, the disclosed sensor apparatus 2 and sensor readout apparatus 14 advantageously performs sensor signal amplification and integration with sample-hold functionality in a single circuit, thus providing a compact, low power, low noise sensor readout solution for fluxgate magnetic sensor systems 2. In addition, no pre-filtering or sampling capacitors are required, as were used in previous sensor readout circuit designs.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A sensor readout apparatus for providing an output signal from a fluxgate magnetic sensor, comprising:
    a rectifier circuit having an input coupled to an end of a sense coil of the fluxgate magnetic sensor, and an output;
    an amplifier having a differential input coupled to the output of the rectifier circuit, and a differential output; and
    a capacitor coupled between the differential input of the amplifier and the differential output of the amplifier, wherein the differential input of the amplifier has a first amplifier input and a second amplifier input, wherein the differential output of the amplifier has a first amplifier output and a second amplifier output, wherein the capacitor is a first feedback capacitor connected between the first amplifier output and the first amplifier input, and wherein the apparatus further includes a second feedback capacitor connected between the second amplifier output and the second amplifier input.

2. The sensor readout apparatus of claim 1, further comprising a reset circuit operative to selectively discharge the first and second feedback capacitors.

3. The sensor readout apparatus of claim 2, further comprising a control circuit configured to provide a switching control signal to operate the rectifier circuit sequentially in first and second states in each of a plurality of sensing cycles, wherein the control circuit is configured to selectively discharge the first and second feedback capacitors every integer number N sensing cycles, wherein N is greater than or equal to 1.

4. The sensor readout apparatus of claim 3, wherein the integer number N is configurable according to a gain input signal provided to the control circuit.

5. The sensor readout apparatus of claim 1, wherein the input of the rectifier circuit is a first rectifier input, wherein the rectifier circuit includes a second rectifier input, and wherein the apparatus further comprises a disable circuit operative to selectively connect the first and second rectifier inputs together to disable the sensor readout apparatus.

6. The sensor readout apparatus of claim 1, wherein the amplifier is a transconductance amplifier.

7. A sensor readout apparatus for providing an output signal from a fluxgate magnetic sensor, comprising:
    a rectifier circuit having an input coupled to an end of a sense coil of the fluxgate magnetic sensor, and an output;
    an amplifier having an input coupled to the output of the rectifier circuit, and an output;
    a capacitor coupled between the input of the amplifier and the output of the amplifier;
    a reset circuit operative to selectively discharge the capacitor; and
    a control circuit configured to provide a switching control signal to operate the rectifier circuit sequentially in first and second states in each of a plurality of sensing cycles, wherein the control circuit is configured to selectively discharge the capacitor every integer number N sensing cycles, wherein N is greater than or equal to 1.

8. The sensor readout apparatus of claim 7, wherein the integer number N is configurable according to a gain input signal provided to the control circuit.

9. A sensor readout apparatus for providing an output signal from a fluxgate magnetic sensor, comprising:
    a rectifier circuit having a first rectifier input coupled to an end of a sense coil of the fluxgate magnetic sensor, a second rectifier input, and an output;
    an amplifier having an input coupled to the output of the rectifier circuit, and an output;
    a capacitor coupled between the input of the amplifier and the output of the amplifier; and
    a disable circuit operative to selectively connect the first and second rectifier inputs together to disable the sensor readout apparatus.

10. The sensor readout apparatus of claim 9, further comprising a reset circuit operative to selectively discharge the capacitor.

11. The sensor readout apparatus of claim 9, wherein the amplifier is a transconductance amplifier.

12. A magnetic sensing apparatus, comprising:
    a fluxgate sensor structure, including a core structure, at least one excitation coil wound around at least a portion of the core structure, and a sense coil;
    an excitation circuit configured to provide a periodic bidirectional excitation current waveform to the excitation coil;
    a control circuit configured to control timing of the periodic bidirectional excitation current waveform; and
    a sensor readout circuit, comprising:
        a rectifier circuit having an input coupled to an end of the sense coil of the fluxgate magnetic sensor, and an output;
        an amplifier having an input coupled to the output of the rectifier circuit, and an output; and
        a capacitor coupled between the input of the amplifier and the output of the amplifier.

13. The magnetic sensing apparatus of claim 12,
    wherein the input of the rectifier circuit is a first rectifier input, the end of the sense coil is a first end of the sense coil, and the output of the rectifier circuit is a first rectifier output,
    wherein the rectifier circuit includes:
        a second rectifier input coupled to a second end of the sense coil;
        a second rectifier output; and
        a switching circuit operative in a first state to electrically couple the first rectifier input to the first rectifier output and to electrically couple the second rectifier input to the second rectifier output, and in a second state to electrically couple the first rectifier input to the second rectifier output and to electrically couple the second rectifier input to the first rectifier output, and
    wherein the control circuit is configured to provide at least one switching control signal to alternate operation of the switching circuit between the first and second states.

14. The magnetic sensing apparatus of claim 13, wherein the input of the amplifier is a differential input having a first amplifier input and a second amplifier input, wherein the output of the amplifier is a differential output having a first amplifier output and a second amplifier output, wherein the capacitor is a first feedback capacitor connected between the first amplifier output and the first amplifier input, and wherein the apparatus further includes a second feedback capacitor connected between the second amplifier output and the second amplifier input.

15. The magnetic sensing apparatus of claim 12, further comprising
    a reset circuit operative to selectively discharge the capacitor,
    wherein the control circuit is configured to operate the excitation circuit and the rectifier circuit in each of a plurality of sensing cycles individually corresponding to one period of the periodic bidirectional excitation signal, and
    wherein the control circuit is configured to selectively discharge the capacitor every integer number N sensing cycles, wherein N is greater than or equal to 1.

16. The magnetic sensing apparatus of claim 12, further comprising a disable circuit operative to selectively disable the sensor readout circuit.

17. The magnetic sensing apparatus of claim 12, wherein the amplifier is a transconductance amplifier.

18. A sensor interface circuit for interfacing a fluxgate magnetic sensor, comprising:
- an excitation circuit configured to provide a periodic bidirectional excitation current waveform to an excitation coil of the fluxgate sensor according to at least one excitation timing control signal;
- a sensor readout circuit, comprising:
    - a rectifier circuit having an input coupled to an end of a sense coil of the fluxgate magnetic sensor, and an output;
    - an amplifier having an input coupled to the output of the rectifier circuit, and an output; and
    - a capacitor coupled between the input of the amplifier and the output of the amplifier; and
- a control circuit providing the at least one excitation timing control signal to control timing of the periodic bidirectional excitation current waveform.

19. The sensor interface circuit of claim 18, further comprising:
- a reset circuit operative to selectively discharge the capacitor,
- wherein the control circuit is configured to operate the excitation circuit and the rectifier circuit in each of a plurality of sensing cycles individually corresponding to one period of the periodic bidirectional excitation signal, and
- wherein the control circuit is configured to selectively discharge the capacitance every integer number N sensing cycles, wherein N is greater than or equal to 1.

* * * * *